(12) United States Patent
Sun et al.

(10) Patent No.: US 9,608,027 B2
(45) Date of Patent: Mar. 28, 2017

(54) STACKED EMBEDDED SPAD IMAGE SENSOR FOR ATTACHED 3D INFORMATION

(71) Applicant: OMNIVISION TECHNOLOGIES, INC., Santa Clara, CA (US)

(72) Inventors: Tianjia Sun, San Jose, CA (US); Rui Wang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 109 days.

(21) Appl. No.: 14/624,198

(22) Filed: Feb. 17, 2015

(65) Prior Publication Data

US 2016/0240579 A1    Aug. 18, 2016

(51) Int. Cl.

| H01L 27/14 | (2006.01) |
|---|---|
| H01L 27/146 | (2006.01) |
| G01S 17/89 | (2006.01) |
| G01S 17/02 | (2006.01) |
| G01S 7/481 | (2006.01) |
| G01S 7/491 | (2006.01) |
| H04N 9/04 | (2006.01) |

(52) U.S. Cl.
CPC ...... *H01L 27/14647* (2013.01); *G01S 7/4816* (2013.01); *G01S 7/4914* (2013.01); *G01S 17/023* (2013.01); *G01S 17/89* (2013.01); *H01L 27/14634* (2013.01); *H01L 27/14645* (2013.01); *H01L 27/14652* (2013.01); *H04N 9/045* (2013.01)

(58) Field of Classification Search
CPC .. H01L 27/14647; H04N 5/378; H04N 5/374; G01S 17/898
See application file for complete search history.

(56) References Cited

U.S. PATENT DOCUMENTS

| 9,200,954 B2* | 12/2015 | Lin | G01J 1/44 |
|---|---|---|---|
| 2016/0181295 A1* | 6/2016 | Wan | H01L 27/1465 348/164 |
| 2016/0182846 A1* | 6/2016 | Wan | H04N 5/378 348/302 |

\* cited by examiner

*Primary Examiner* — Tony Ko
(74) *Attorney, Agent, or Firm* — Blakely Sokoloff Taylor & Zafman LLP

(57) ABSTRACT

A pixel array includes a plurality of visible light pixels arranged in the pixel array. Each one of the plurality of visible light pixels includes a photosensitive element arranged in a first semiconductor die to detect visible light. Each one of the plurality of visible light pixels is coupled to provide color image data to visible light readout circuitry disposed in a second semiconductor die stacked with and coupled to the first semiconductor die in a stacked chip scheme. A plurality of infrared (IR) pixels arranged in the pixel array. Each one of the plurality of IR pixels includes a single photon avalanche photodiode (SPAD) arranged in the first semiconductor die to detect IR light. Each one of the plurality of visible light pixels is coupled to provide IR image data to IR light readout circuitry disposed in the second semiconductor die.

14 Claims, 5 Drawing Sheets

STACKED EMBEDDED SPAD IMAGE SENSOR FOR ATTACHED 3D INFORMATION

BACKGROUND INFORMATION

Field of the Disclosure

This invention is related to image sensors. More specifically, examples of the present invention are related to three dimensional image sensors.

Background

Interest in three dimensional (3D) cameras is increasing as the popularity of 3D applications continues to grow in applications such as imaging, movies, games, computers, user interfaces, and the like. A typical passive way to create color 3D images is to use multiple cameras to capture stereo or multiple images. Using the stereo images, objects in the images can be triangulated to create the color 3D image. One disadvantage with this triangulation technique is that it is difficult to create color 3D images using small devices because there must be a minimum separation distance between each camera in order to create the color 3D images. In addition, this technique is complex and therefore requires significant computer processing power in order to create the color 3D images in real time. Furthermore, the use of multiple cameras can increase the size and cost of the imaging system.

For applications that require the acquisition of color 3D images in real time, active depth imaging systems based on the optical time of flight measurement are sometimes utilized. Time of flight systems typically employ a light source that directs light at an object, a sensor that detects the light that is reflected from the object, and a processing unit that calculates the distance to the object based on the round trip time that it takes for light to travel to and from an object. In typical time of flight sensors, photodiodes are often used because of the high transfer efficiency from the photo detection regions to the sensing nodes.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
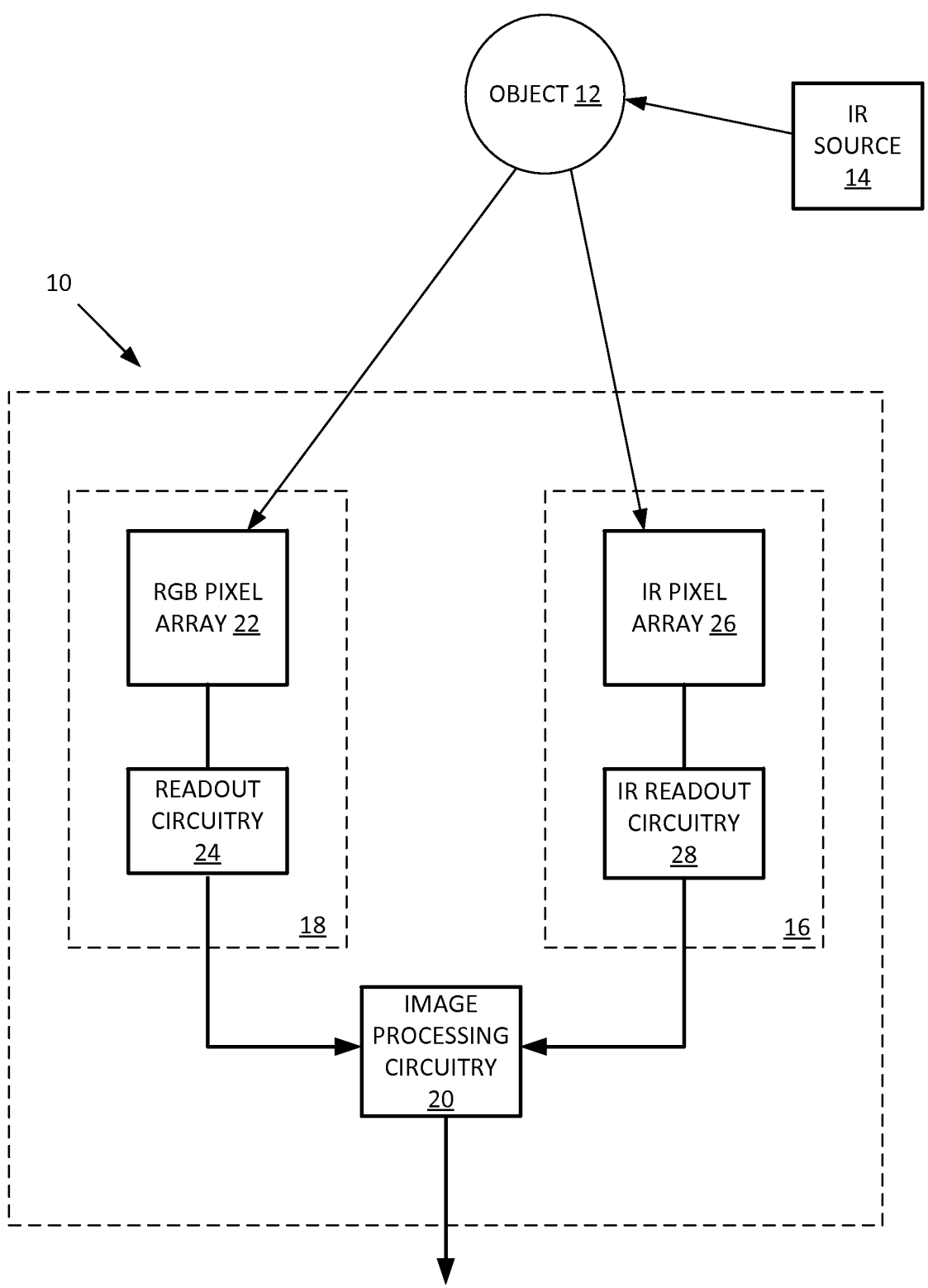
FIG. 1 is a schematic block diagram that shows an example of an imaging system for generating a three-dimensional color image of an object or scene.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

An apparatus and system for obtaining color 3D images using time of flight and depth information are disclosed. In the following description numerous specific details are set forth to provide a thorough understanding of the embodiments. One skilled in the relevant art will recognize, however that the techniques described herein can be practiced without one or more of the specific details, or with other components, materials, etc. In other instances, well-known structures, materials or operation are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

FIG. 1 illustrates a schematic block diagram of an example imaging system 10 that can generate a color 3D image of an object or scene 12. Imaging system 10 can be used, for example, as part of a color camera for a 3D gesture recognition system, which can be used for example in a video game system. As shown in FIG. 1, imaging system 10 includes an optical imager or camera 18, which receives and processes visible light from a scene or object 12. In the example, camera 18 produces red (R), green (G) and blue (B) color image data of the scene or object 12. As such, camera 18 may also be referred to as an "RGB camera." Visible light is received by an RBG pixel array 22, and visible image data is read out by readout circuitry 24.

In the example, imaging system 10 also includes an infrared (IR) source 14, which illuminates scene or object 12 with IR light. In one example, IR source 14 may include an IR laser or the like to provide the IR light. An IR imager or camera 16 receives and processes the IR light returning from scene or object 12 to generate IR image data of scene or object 12. As such, IR light is received by IR pixel array 26, and IR image data is read out by IR readout circuitry 28.

In the example, frames of image data from RGB camera 18 and IR camera 16 are transmitted to image processing circuitry 20, which processes the received data to generate a 3D color image of scene or object 12. Image processing circuitry 20 uses the data from RGB camera 18 to generate a color image, and the data from IR camera 16 to provide depth information to generate the color 3D image. Thus, the imaging system 10 of FIG. 1 includes a separate RGB camera 18 and IR camera 16 to generate a color 3D image. It is noted, however, that by utilizing multiple cameras, e.g., RGB camera 18 and IR camera 16, there are multiple sets of control signal lines and multiple sets of data, which result in imaging system 10 having a large and complex form factor, as well as a relatively high cost.

In one example, 3D color images can be obtained by using an imaging system in which the RGB camera and the IR camera are combined in a single image pixel array. For instance, in one example, an imaging system includes an image pixel array having a plurality of visible light pixels, and a plurality of silicon photon avalanche diode (SPAD) pixels. In the example, each of the plurality of visible light pixels includes a photosensitive element, such as for example a photodiode, to receive a portion of light, and pixel support circuitry to generate a signal representative of an intensity of the received portion of light. Each of the plurality of SPAD pixels includes an avalanche diode to detect the distance to an object, and SPAD pixel support circuitry coupled to the avalanche photodiode. The array of photosensitive elements and SPAD pixels are disposed on a sensor die, and the pixel support circuitry of the visible light pixels and SPAD pixels are disposed on an application specific integrated circuit (ASIC) die. The sensor die and ASIC die are stacked together.

In the example, a filter is disposed above each of the plurality of visible light pixels and each of the plurality of SPAD pixels. Each filter passes a predetermined band of wavelength or color of light. Each filter is aligned with an associated photosensitive element of the visible light pixel or the avalanche diode of the SPAD pixel. At least one of the filters is adapted to pass a band of wavelengths in a visible color band, and at least one other of the filters is adapted to pass a band of wavelengths in an infrared band.

Figure 2:
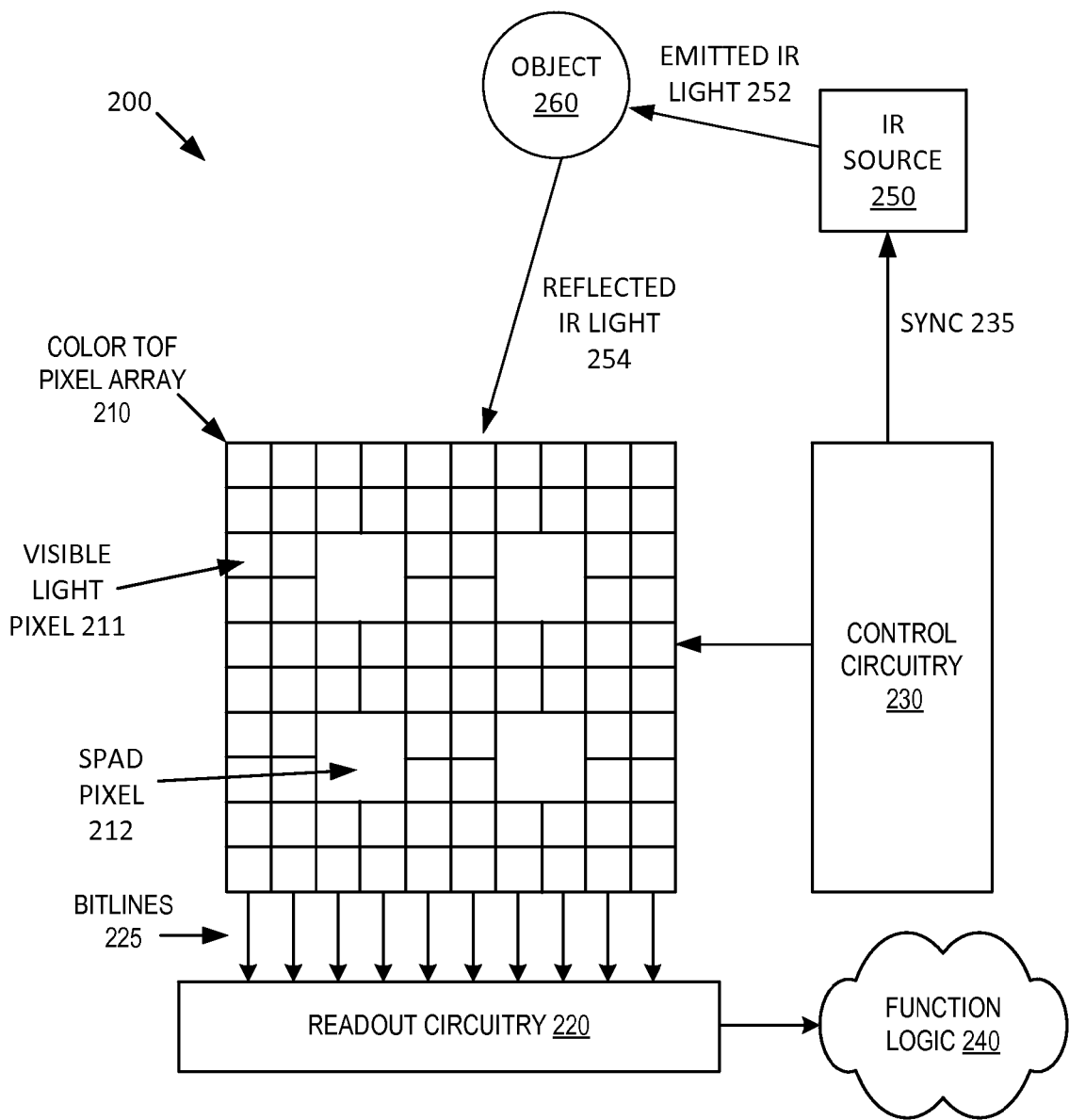
FIG. 2 is a block diagram that shows a portion of an example of a 3D color image sensor including a color time of flight pixel array with corresponding readout circuitry, control circuitry and function logic in accordance with the teachings of the present invention.

To illustrate, FIG. 2 is a block diagram that shows a portion of an example of stacked 3D color image sensor 200 that includes a time of flight pixel array with corresponding readout circuitry, control circuitry and function logic in accordance with the teachings of the present invention. In particular, as illustrated in the depicted example, stacked 3D color image sensor 200 includes a color time of flight (TOF) pixel array 210, readout circuitry 220, control circuitry 230, function logic 240 and IR source 250. In the example, the IR source 250 emits pulses IR light 252, which can be used to sense the round trip distance to object 260 based on the time of flight of the pulses of IR light. In particular, the round trip distance can be determined by measuring the amount of time that it takes for the emitted IR light pulses 252 to travel from the IR source 250 to the object 260 and back to the color TOF pixel array 210 in accordance with the teachings of the present invention. By determining the round trip distance to object 260, 3D information can be determined. The stacked 3D color image sensor 200 of FIG. 2 can be used, for example in a variety of applications, such as portion of a camera included for example in a 3D gesture recognition system in a video game system or the like. In one example, IR source 250 may include an IR laser to emit IR light 252 to illuminate object 260.

In the illustrated example in FIG. 2, color TOF pixel array 210 is a two-dimensional (2D) array of visible light pixels 211 and SPAD pixels 212 disposed in the semiconductor material of a semiconductor sensor die. Reflected IR light 254 from object 260 may be detected with a plurality of SPAD pixels 212 in color TOF pixel array 210 to provide IR image data. The plurality of visible light pixels 211 in color TOF pixel array 210 detects visible light from object 260 to provide color image data. In one example, each of the plurality of visible light pixels 211 includes a photosensitive element such as a photodiode to receive a portion of light, as well as pixel support circuitry to generate a signal representative of an intensity of the received portion of light. Each of the plurality of SPAD pixels 212 includes an avalanche diode and SPAD pixel support circuitry.

As shown in the depicted example, each one of the plurality of SPAD pixels 212 is surrounded on all lateral sides in the semiconductor material of the color TOF pixel array 210 by a visible light pixel 211. As such, the plurality of SPAD pixels 212 is distributed throughout the color TOF pixel array 210 among the plurality of visible light pixels 211 in the semiconductor material of the semiconductor sensor die in accordance with the teachings of the present invention. In one example, the ratio of the size between SPAD pixel 212 and visible light pixel 211 is 4 to 1. In another example, the ratio of the size between SPAD pixel 212 and visible light pixel may be another value such as 9 to 1. In another example, the size of the SPAD pixel is N times greater than the size of the visible light pixel, where N is an integer value. Since stacked 3D color image sensor 200 includes a sensor die stacked with an ASIC die in a stacked chip scheme, the photosensitive element may take up substantially the entire area of visible light pixel 211 and the avalanche diode may take up substantially the entire area of SPAD pixel 212.

In the depicted example, control circuitry 230 is coupled to control operation of color TOF pixel array 210, as well as control and synchronize IR source 250 with a sync signal 235 to emit pulses of IR light 252 to object 260 to synchronize a timing of the emission of the IR light pulses 252 with the sensing of the photons reflected from the object 260 with SPAD pixels 212. In particular, the reflected IR light 254 is reflected from object 260 back to color TOF pixel array 210. Visible light is detected with the visible light pixels 211 and reflected IR light 254 is detected with the plurality of SPAD pixels 212.

Frames of color image data and IR image data are transferred through bit lines 225 from color TOF pixel array 210 to visible light readout circuitry and IR light readout circuitry included in readout circuitry 220. Readout circuitry 220 may include amplifiers to amplify the signals received through bit lines 225. Bit lines 225 may be used to couple visible light pixels 211 disposed on the same column. Each of the plurality of SPAD pixels 212 in color time of flight pixel array 210 may be coupled to its own respective readout circuit, which is different from the readout circuit of visible light pixels 211. The information read out by the visible light readout circuitry and the IR light readout circuitry in readout circuitry 220 may then be transferred to digital circuits included in function logic 240 to store and process information readout out from the color TOF pixel array 210. In one example, function logic 240 may determine the time of flight and distance information from each of the plurality of SPAD pixels 212 of color TOF pixel array 210. In one example, function logic 240 may manipulate the color image data and/or IR image data (e.g., crop, rotate, adjust for background noise, or the like). In one example function logic 240 may combine the color image data and time of flight information in the IR image data to provide a color 3D image.

As mentioned, it is noted that 3D color image sensor 200 illustrated in FIG. 2 may be implemented in a stacked chip scheme. For instance, the array of photosensitive elements of the visible light pixels 211 and avalanche diodes of the SPAD pixels 212 may be disposed on a sensor die. The pixel support circuitry of the visible light pixels 211, and the pixel support circuitry of the SPAD pixels 212, as well as readout circuitry 220, control circuitry 230 and function logic 240 may be disposed on a separate ASIC die. In the example, the sensor die and ASIC die are stacked and coupled together during fabrication in a stacked chip scheme to implement a 3D color image sensing system in accordance with the teachings of the present invention.

Figure 3:
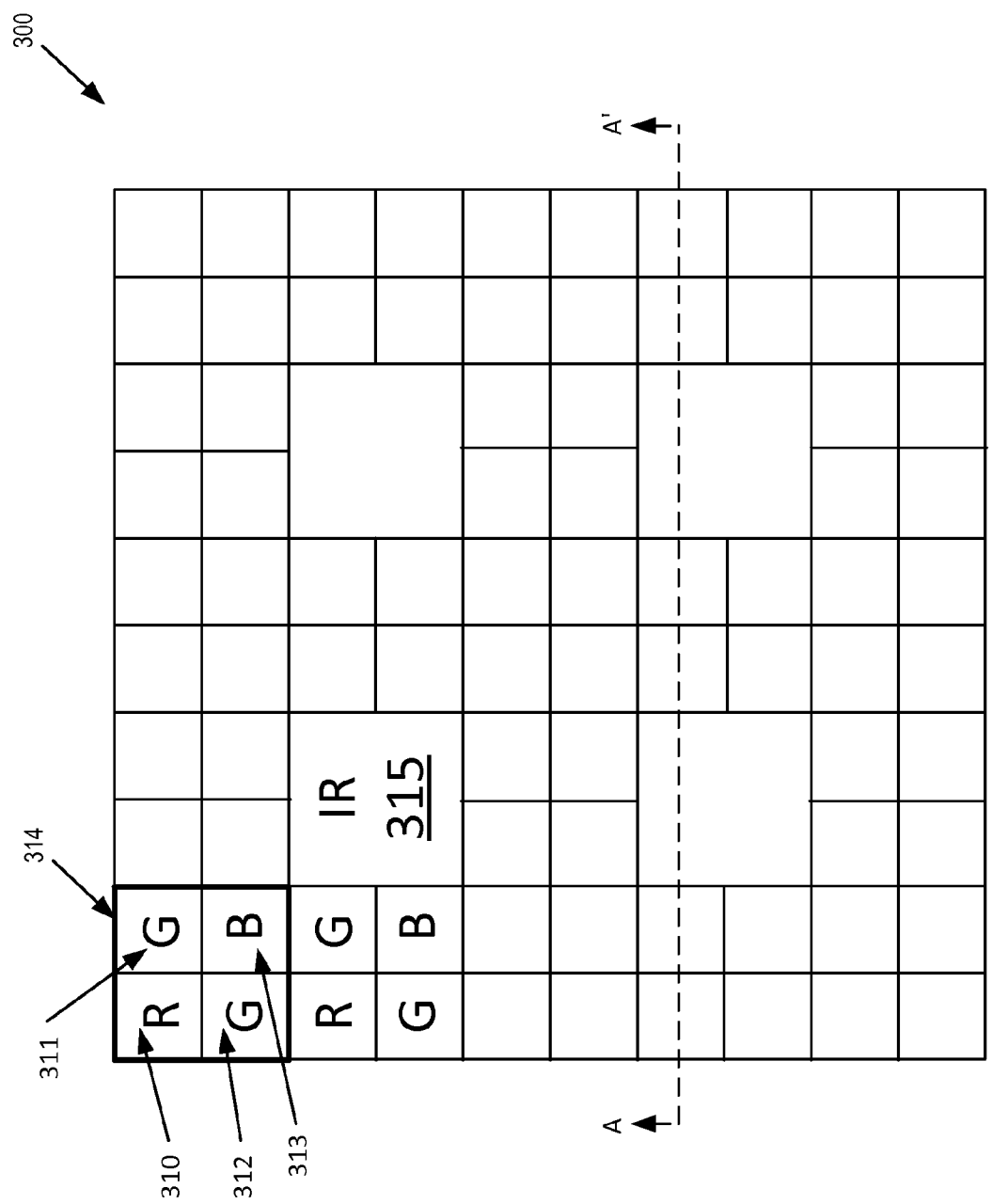
FIG. 3 is an illustration that shows an example RGB-IR filter array disposed over an example color time of flight pixel array in accordance with the teachings of the present invention.

FIG. 3 is an illustration that shows an example RGB-IR filter array disposed over an example color TOF pixel array in accordance with the teachings of the present invention. In the depicted example, RGB-IR filter array 300 is disposed over one example of the color TOF pixel array 210 of FIG. 2 in accordance with the teachings of the present invention. Referring back to FIG. 3, each filter 310, 311, 312, and 313 in filter 314 is aligned with a corresponding underlying photosensitive element of a visible light pixel 211, while filter 315 is aligned with a corresponding underlying avalanche diode of a SPAD pixel 212. In one example, the photosensitive element of visible light pixel 211 may be substantially the same size as each filter 310, 311, 312, 313 of filter 314, and the avalanche diode of SPAD pixel 212 may be substantially the same size as filter 315. In one example, filters 310, 311, 312, and 313 are color filters that are arranged in a repeating pattern, such as for example a Bayer pattern or the like, with a smallest repeating color filter unit 314 including a grouping of four color filters 310, 311, 312, and 313 as shown. In one example, the size of repeating color filter unit 314 is substantially the same size as filter 315. In one example, filters 310, 311, 312, and 313 may be R, G, G, and B color filters, respectively, making filter array 300 an RGB-IR filter array. In one example, filter array 300 may be a CYM-IR filter, or a CYGM-IR filter array, or the like.

Figure 4A:
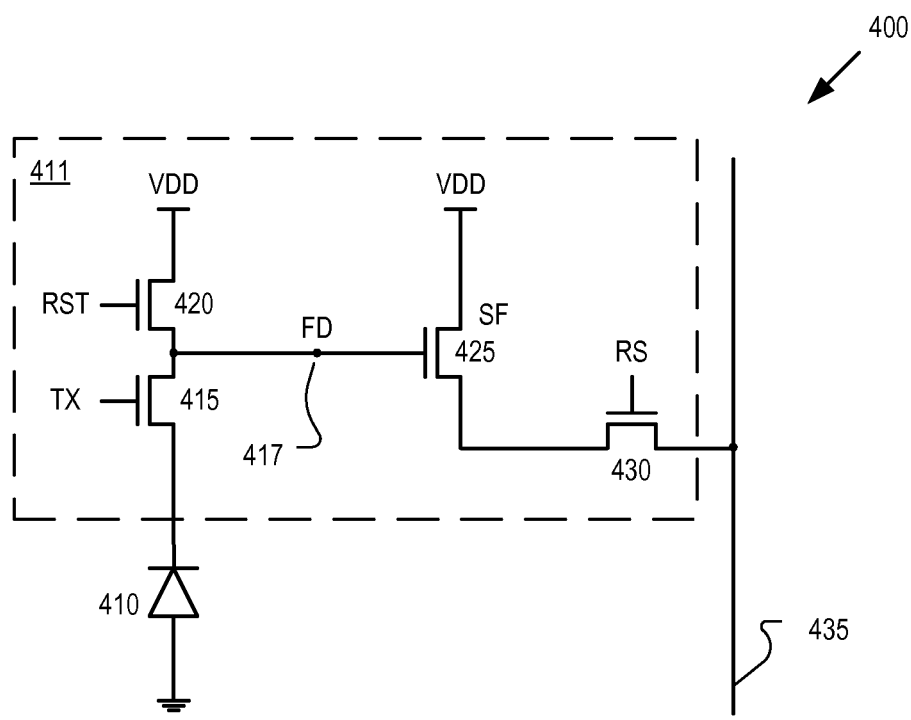
FIG. 4A is a schematic that illustrates one example of a stacked visible light pixel in accordance with the teachings of the present invention

FIG. 4A is a schematic that illustrates one example of a four-transistor (4T) pixel cell stacked chip visible light pixel in accordance with the teachings of the present invention. The pixel circuitry illustrated in FIG. 4A is one possible example of the visible light pixel circuitry architecture for implementing each visible light pixel 211 of color time of flight pixel array 210 of FIG. 2. Referring back to FIG. 4A, each visible light pixel 400 includes a photosensitive element 410 (e.g., photodiode) and pixel support circuitry 411 as shown. Photosensitive element 410 may be disposed on a sensor die of a stacked die system, while pixel support circuitry 411 may be disposed on an ASIC die. In one example, pixel support circuitry 411 includes a transfer transistor 415 coupled to photosensitive element 410, reset transistor 420, source follower (SF) transistor 425, and row select transistor 430 as shown.

During operation, photosensitive element 410 photo-generates charge in response to incident light during an exposure period. Transfer transistor 415 is coupled to receive a transfer signal TX, which causes transfer transistor 415 to transfer the charge accumulated in photodiode 410 to floating diffusion (FD) node 417. Reset transistor 420 is coupled between power rail VDD and floating diffusion node 417 to reset visible light pixel 400 (e.g., discharge or charge floating diffusion node 417 and photodiode 410 to a preset voltage) in response to a reset signal RST.

Floating diffusion node 417 is coupled to control the gate terminal of source-follower transistor 425. Source-follower transistor 425 is coupled between power rail VDD and row select transistor 430 to amplify a signal responsive to the charge on the floating diffusion FD node 417. Row select transistor 430 couples the output of pixel circuitry from the source-follower transistor 425 to the readout column, or bit line 435, in response to a row select signal RS.

Photosensitive element 410 and floating diffusion node 417 are reset by temporarily asserting the reset signal RST and transfer signal TX. The accumulating window (e.g., exposure period) begins when the transfer signal TX is de-asserted, which permits incident light to photo-generate charge in photosensitive element 410. As photo-generated electrons accumulate in photosensitive element 410, its voltage decreases (electrons are negative charge carriers). The voltage or charge on photodiode 410 is representative of the intensity of the light incident on photosensitive element 410 during the exposure period. At the end of the exposure period, the reset signal RST is de-asserted, which turns off the reset transistor 420 and isolates floating diffusion FD node 417 from VDD. The transfer signal TX is then asserted to couple photosensitive element 410 to floating diffusion node 417. The charge is transferred from photosensitive element 410 to the floating diffusion FD node 417 through the transfer transistor 415, which causes the voltage of floating diffusion FD node 417 to drop by an amount proportional to photo-generated electrons accumulated on photosensitive element 410 during the exposure period.

Figure 4B:
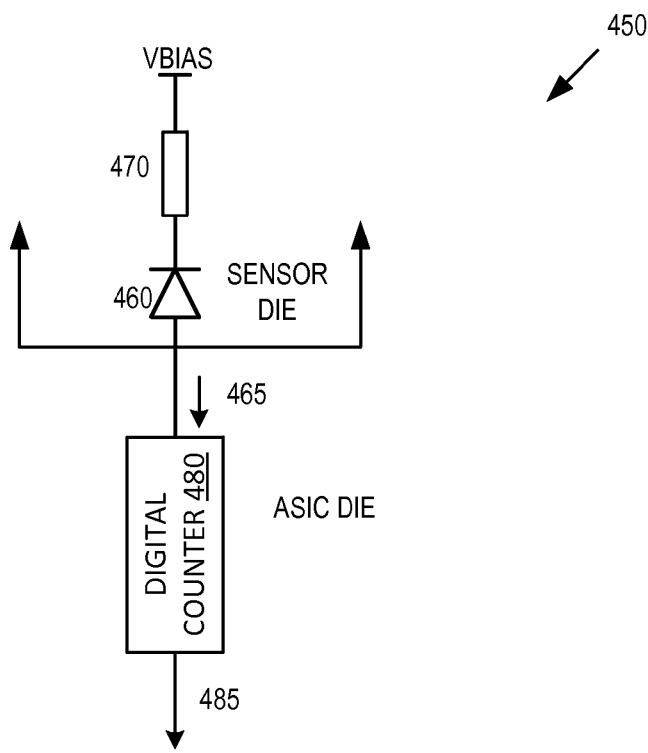
FIG. 4B is a schematic that illustrates one example of a stacked chip SPAD pixel including quenching elements in accordance with the teachings of the present invention.

FIG. 4B is a schematic that illustrates one example of a stacked chip SPAD pixel including quenching elements in accordance with the teachings of the present invention. The pixel circuitry illustrated in FIG. 4B is one possible example of the SPAD pixel circuitry architecture for implementing each SPAD pixel 212 of color time of flight pixel array 210 of FIG. 2. Referring back to FIG. 4B, each SPAD pixel 450 includes an avalanche diode 460, quenching element 470, and digital counter 480 coupled as shown. Avalanche diode 460 is coupled to quenching element 470, and both may be disposed on the sensor die of the stacked die system, while digital counter 480 included in readout circuitry is disposed on the ASIC die. In other examples, quenching element 470 may be included in the sensor die or the ASIC die in accordance with the teachings of the present invention. It is also appreciated that quenching element 470 may be implemented using passive or active quenching elements in accordance with the teachings of the present invention.

Digital counter 480 may be implemented using CMOS circuitry disposed on the ASIC die fabricated using a standard CMOS process of the stacked die system, and is electrically coupled to receive an output pulse 465 generated by avalanche diode 460 in response to a received photon. Digital counter 480 may be enabled to count the number of output pulses 465 generated by avalanche diode 460 during a window of time, and to output a digital signal 485 that is representative of the count. Although the example depicted in FIG. 4B illustrates a direct connection between the pixel circuitry including avalanche photodiode 460 and the digital counter 480, it is appreciated that any connection between the pixel circuitry including avalanche photodiode 460 and the digital counter 480, including by way of AC coupling, may be utilized in accordance with the present teachings. In one example, each digital counter 480 includes an amplifier to amplify the received output pulse 465. Alternately, or in addition to digital counters 480, timing circuitry can be placed in each pixel/column/array to time the arrival of incident photons to determine the time of flight of the photons and round trip distance to the object in accordance with the teachings of the present invention.

In operation, each avalanche diode 460 is reverse biased via a bias voltage VmAs that is above the breakdown voltage of each avalanche diode 460. In response to a single photogenerated carrier that is generated in response to an incident photon, an avalanche multiplication process is triggered that causes an avalanche current at the output of each avalanche diode 460. This avalanche current self-quenches in response to a voltage drop that is developed across the quenching element 470, which causes the bias voltage across the avalanche diode 460 to drop. After the quenching of the avalanche current, the voltage across the avalanche diode 460 recovers to above the bias voltage and then the avalanche diode 460 is ready to be triggered again. The resulting output pulse 465 of each avalanche diode 460 is received by its respective digital counter 480, which increments its count in response thereto.

Conventional SPAD pixel designs that incorporate SPADs on the same chips as the CMOS digital counters fabricated using a standard CMOS process suffer from reduced fill factor on the imaging plane due to the area occupied by the CMOS circuits themselves. Accordingly, one advantage of implementing a stacked chip structure provides an improved fill factor on the imaging plane in accordance with the teachings of the present invention.

It is noted that the circuit diagram of FIG. 4B is provided herewith for explanation purposes and that some other circuit elements (e.g., passive components such as resistors and capacitors, and active components such as transistors) are not shown in detail so as not to obscure the teachings of the present invention. For example, the illustrated pixel circuitry of FIG. 4B may produce an output pulse 465 that requires amplification prior to being sensed by the input of the digital counters 480. In another example, the connection at the node between quenching element 470 and avalanche diode 460 would be at a high voltage, which may require AC coupling.

Figure 5:
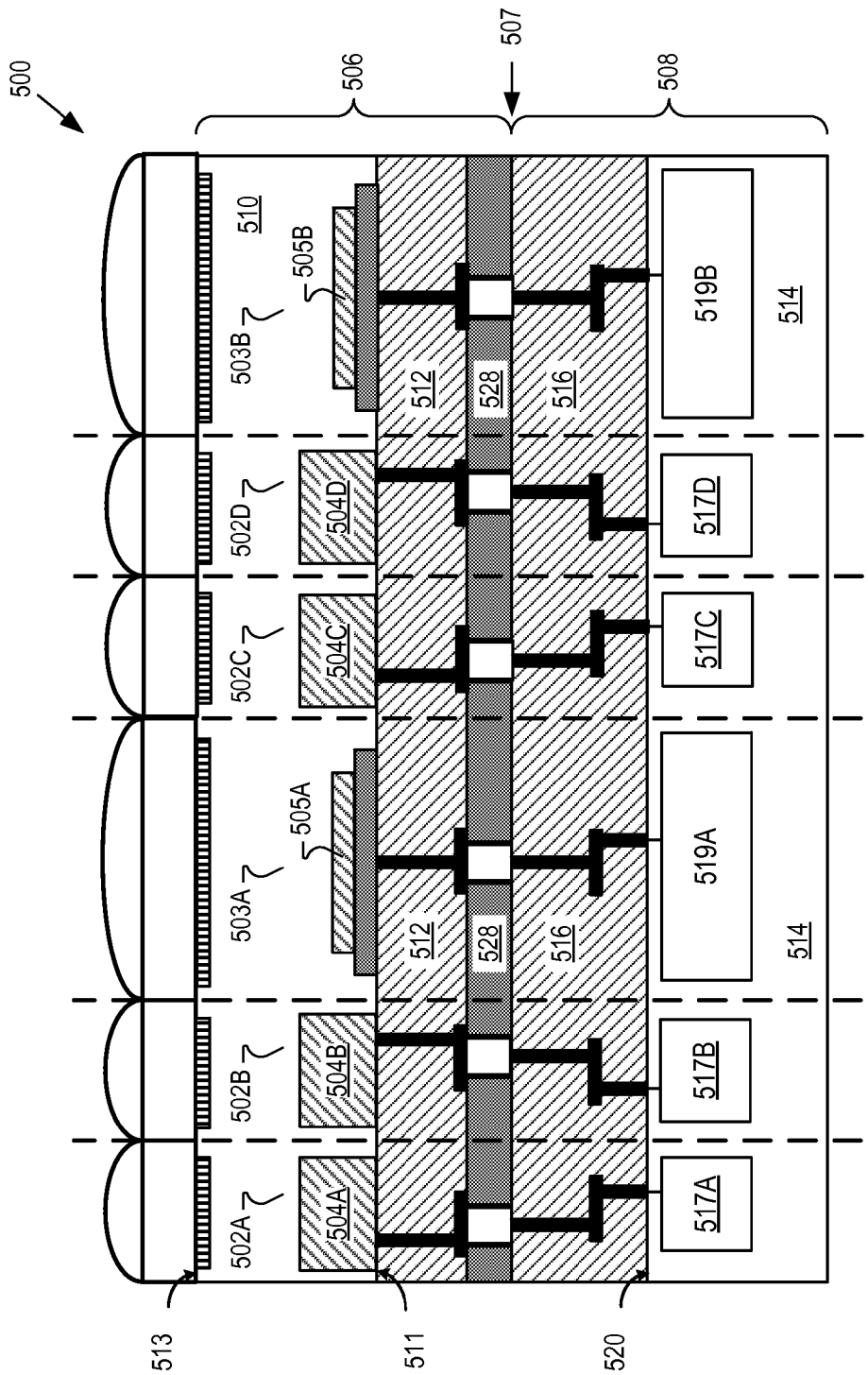
FIG. 5 is a cross-sectional view of an integrated circuit system including a 3D color image sensor with stacked dies in accordance with the teachings of the present invention.

FIG. 5 is a cross-sectional view of one example of an integrated circuit system 500 including 3D color pixel array with stacked device dies in accordance with the teachings of the present invention. Integrated circuit system 500 is one possible implementation of color time of flight pixel array 210 of FIG. 2 with RGB-IR filter array 300 of FIG. 3. For instance, the integrated circuit system 500 of FIG. 5 may be a cross-sectional view along dashed line A-A' of FIG. 3. The illustrated example of integrated circuit system 500 shown in FIG. 5 includes a first device die 506, a second device die 508 and a bonding interface 507 at which first device die 506 is bonded to second device die 508. The first device die 506 includes a first semiconductor layer 510 and a first interconnect layer 512, while the second device die 508 includes a second semiconductor layer 514 and a second interconnect layer 516. The illustrated example shows a plurality of visible light pixels, 502A, 502B, 502C and 502D, as well as a plurality of SPAD pixels 503A and 503B, which are arranged in rows and columns, such as for example as also illustrated in FIGS. 2 and 3.

In one example, visible light pixels 502A, 502B, 502C and 502D may each include a photosensitive region, or photodiode 504A, 504B, 504C, and 504D, respectively, disposed near a front side 511 of first semiconductor layer 510. In one example, SPAD pixels 503A and 503B may each include multiplication regions 505A and 505B, respectively, that are formed near front side 511 of first semiconductor layer 510. In the depicted example, the photodiodes 504A, 504B, 504C, and 504D, as well as the multiplication regions 505A and 505B are configured to be illuminated through a back side 513 of first semiconductor layer 510 in accordance with the teachings of the present invention.

In one example, second device die 508 is a CMOS logic die that is fabricated using a standard CMOS process and includes second semiconductor layer 514, which includes visible light readout circuitry 517A, 517B, 517C, and 517D, as well as IR light readout circuitry 519A and 519B. In one example, IR light readout circuitry 519A and 519B includes digital counters similar to for example digital counter 480 of FIG. 4. In one example, hybrid bond vias 528 are included at the bonding interface 507 as shown. For instance, in one example the hybrid bond vias 528 may be included to transfer the voltage of the SPAD pixels 503A and 503B included in the first device die 506 to IR light readout circuitry 519A and 519B included in the second device die 508. Each of the visible light readout circuitry 517A, 517B, 517C, and 517D may include sample and hold circuits and analog-to-digital conversion (ADC) circuits. As shown in the depicted example, visible light readout circuitry 517A, 517B, 517C, and 517D, as well as IR light readout circuitry 519A and 519B are formed near a front side 520 of second semiconductor layer 514. In the illustrated example, visible light readout circuitry 517A, 517B, 517C, and 517D are disposed in the region of semiconductor layer 514 within their respective visible light pixel (e.g., 502A, 502B, 502C, and 502D, respectively). Similarly, IR light readout circuitry 519A and 519B are disposed in the region of semiconductor layer 514 within their respective SPAD pixel (e.g., 503A and 503B, respectively). In other examples, visible light readout circuitry of adjacent visible light pixels within color time of flight pixel array can be grouped to create communal die real estate. This communal die real estate may be used by the digital counters in IR light readout circuitry of neighboring SPAD pixels.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pixel array, comprising:
   a plurality of visible light pixels arranged in the pixel array, wherein each one of the plurality of visible light pixels includes a photosensitive element arranged in a first semiconductor die to detect visible light, wherein the plurality of visible light pixels is arranged in the pixel array having color filters arranged in a Bayer pattern having a repeating pattern of a red color filter, a first green color filter, a second green color filter, and a blue color filter to provide color image data, wherein each one of the plurality of visible light pixels is coupled to provide the color image data to visible light readout circuitry disposed in a second semiconductor die stacked with and coupled to the first semiconductor die in a stacked chip scheme; and
   a plurality of infrared (IR) pixels arranged in the pixel array, wherein each one of the plurality of IR pixels includes a single photon avalanche photodiode (SPAD)

arranged in the first semiconductor die to detect IR light, wherein each one of the plurality of IR light pixels is coupled to provide IR image data to IR light readout circuitry disposed in the second semiconductor die, wherein each one of the plurality of IR pixels is surrounded on all lateral sides in the first semiconductor die by the plurality of visible light pixels, wherein the plurality of IR pixels is distributed throughout the pixel array among the plurality of visible light pixels in the first semiconductor die.

2. The pixel array of claim 1 wherein a ratio of a size between each one of the plurality of IR pixels and each one of the plurality of visible light pixels is 4 to 1.

3. The pixel array of claim 1 wherein the plurality of visible light pixels and the plurality of IR pixels are adapted to be illuminated through a back side of the first semiconductor die.

4. The pixel array of claim 1 wherein the IR image data provided by the plurality of IR light pixels provide time of flight information to provide three dimensional (3D) image data.

5. The pixel array of claim 1 wherein the plurality of visible light pixels and the plurality of IR light pixels in the first semiconductor die are coupled to the visible light readout circuitry and the IR light readout circuitry in the second semiconductor die through hybrid bond vias at a bonding interface between the first semiconductor die and the second semiconductor die.

6. The pixel array of claim 1 wherein the second semiconductor die is an application specific integrated circuit (ASIC) die.

7. The pixel array of claim 1 wherein the IR light readout circuitry includes a plurality of digital counters coupled to count output pulses generated by each SPAD of each one of the plurality of IR pixels in response to received photons.

8. An image sensing system, comprising:
a light source to emit infrared (IR) light pulses to an object;
a pixel array to receive visible light and reflected IR light pulses from the object, wherein the pixel array includes:
a plurality of visible light pixels arranged in the pixel array, wherein each one of the plurality of visible light pixels includes a photosensitive element arranged in a first semiconductor die to detect the visible light from the object, wherein the plurality of visible light pixels is arranged in the pixel array having color filters arranged in a Bayer pattern having a repeating pattern of a red color filter, a first green color filter, a second green color filter, and a blue color filter to provide color image data, wherein each one of the plurality of visible light pixels is coupled to provide the color image data to visible light readout circuitry disposed in a second semiconductor die stacked with and coupled to the first semiconductor die in a stacked chip scheme; and
a plurality of IR pixels arranged in the pixel array, wherein each one of the plurality of IR pixels includes a single photon avalanche photodiode (SPAD) arranged in the first semiconductor die to detect the reflected IR light pulses from the object to generate time of flight information, wherein each one of the plurality of visible light pixels is coupled to provide IR image data to IR light readout circuitry disposed in the second semiconductor die, wherein each one of the plurality of IR pixels is surrounded on all lateral sides in the first semiconductor die by the plurality of visible light pixels, wherein the plurality of IR pixels is distributed throughout the pixel array among the plurality of visible light pixels in the first semiconductor die; and
control circuitry coupled to control operation of the pixel array and control and synchronize the light source with a sync signal to synchronize a timing of the emission of the light pulses with the sensing of the photons reflected from the object.

9. The image sensing system of claim 8 further comprising function logic coupled to the visible light readout circuitry and the IR light readout circuitry to store and process color image data and the IR image data read out from the pixel array, wherein the function logic is coupled to combine the color image data and the IR image data to generate the time of flight information and provide a color three dimensional (3D) image.

10. The image sensing system of claim 8 wherein a ratio of a size between each one of the plurality of IR pixels and each one of the plurality of visible light pixels is 4 to 1.

11. The image sensing system of claim 8 wherein the plurality of visible light pixels and the plurality of IR pixels are adapted to be illuminated through a back side of the first semiconductor die.

12. The image sensing system of claim 8 wherein the plurality of visible light pixels and the plurality of IR light pixels in the first semiconductor die are coupled to the visible light readout circuitry and the IR light readout circuitry in the second semiconductor die through hybrid bond vias at a bonding interface between the first semiconductor die and the second semiconductor die.

13. The image sensing system of claim 8 wherein the second semiconductor die is an application specific integrated circuit (ASIC) die.

14. The image sensing system of claim 8 wherein the IR light readout circuitry includes a plurality of digital counters coupled to count output pulses generated by each SPAD of each one of the plurality of IR pixels in response to received photons.

* * * * *